(12) United States Patent
Hirata et al.

(10) Patent No.: US 8,162,629 B2
(45) Date of Patent: Apr. 24, 2012

(54) PIEZOELECTRIC PUMP

(75) Inventors: Atsuhiko Hirata, Yasu (JP); Shungo Kanai, Omihachiman (JP); Gaku Kamitani, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 648 days.

(21) Appl. No.: 12/351,158

(22) Filed: Jan. 9, 2009

(65) Prior Publication Data

US 2009/0142209 A1 Jun. 4, 2009

Related U.S. Application Data

(63) Continuation of application No. PCT/JP2007/063645, filed on Jul. 9, 2007.

(30) Foreign Application Priority Data

Jul. 11, 2006 (JP) ................. 2006-190176

(51) Int. Cl.
*F04B 17/00* (2006.01)
(52) U.S. Cl. .................................. 417/413.2
(58) Field of Classification Search ............... 417/413.2, 417/322, 410.1, 412, 413.1, 413.3
See application file for complete search history.

(56) References Cited

U.S. PATENT DOCUMENTS

| 4,625,137 A | 11/1986 | Tomono | |
|---|---|---|---|
| 6,869,275 B2 * | 3/2005 | Dante et al. | 417/413.2 |

FOREIGN PATENT DOCUMENTS

| JP | 61-30974 | 2/1986 |
|---|---|---|
| JP | 61-028776 | 8/1986 |
| JP | 03-054383 | 3/1991 |
| JP | 3-54383 A | 3/1991 |
| JP | 03-134271 | 6/1991 |
| JP | 03-171750 | 7/1991 |
| JP | 03-171784 | 7/1991 |
| JP | 3-171784 A | 7/1991 |
| JP | 08-293632 | 11/1996 |
| JP | 2002-214247 | 7/2002 |
| JP | 2006-118397 | 5/2006 |
| WO | WO-87-07218 | 12/1987 |

OTHER PUBLICATIONS

PCT/JP2007/063645 International Search Report dated Oct. 2, 2007.
PCT/JP2007/063645 Written Opinion dated Oct. 2, 2007.

* cited by examiner

*Primary Examiner* — Mariceli Santiago
*Assistant Examiner* — Donald Raleigh
(74) *Attorney, Agent, or Firm* — Keating & Bennett, LLP

(57) ABSTRACT

A piezoelectric pump includes a pump body with a pump chamber, and a piezoelectric element that closes the pump chamber. The central area and the peripheral area of the piezoelectric element are bent in opposite directions by applying voltages to the piezoelectric element so that the volume of the pump chamber is changed. The piezoelectric element is a laminate including a plurality of piezoelectric layers with electrodes interposed therebetween. The central area and the peripheral area of each piezoelectric layer are polarized opposite to each other in the thickness direction, and the electrodes are formed such that voltages in the same direction in the thickness direction are applied to the central area and the peripheral area of each piezoelectric layer. Since voltages at the same potential are applied to the electrodes formed in the same planes of the piezoelectric layers, short-circuits caused by migration can be prevented.

14 Claims, 12 Drawing Sheets

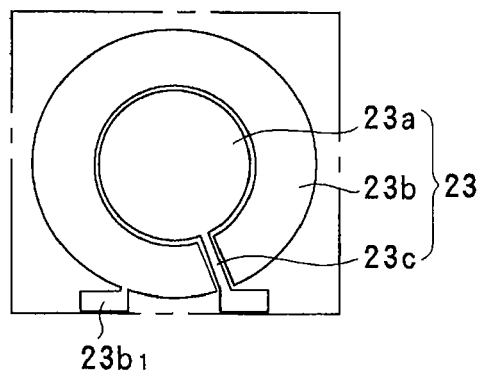
FIG. 6(a)
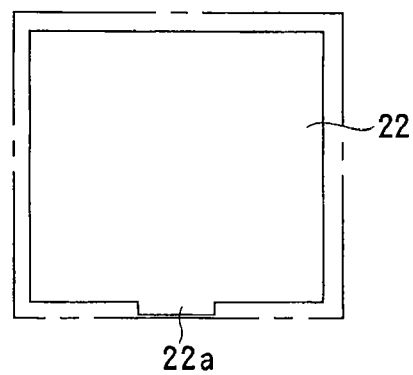
FIG. 6(b)
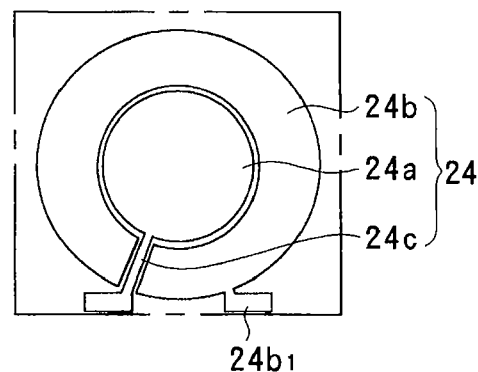
FIG. 6(c)
FIG. 7
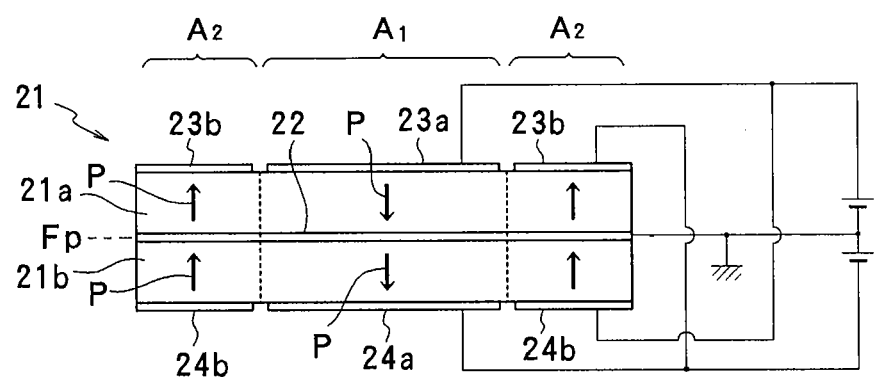

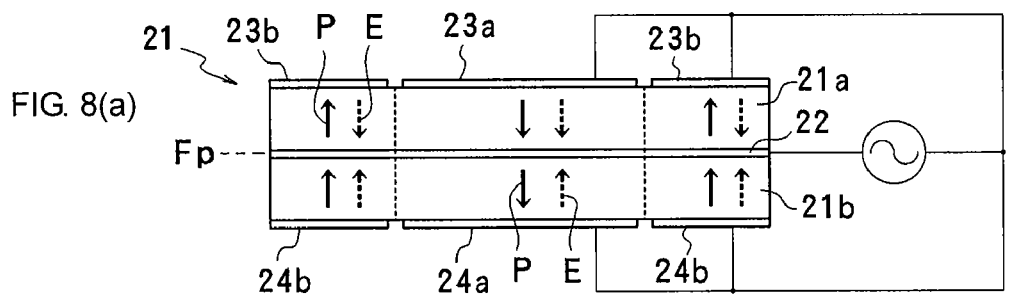
FIG. 8(a)
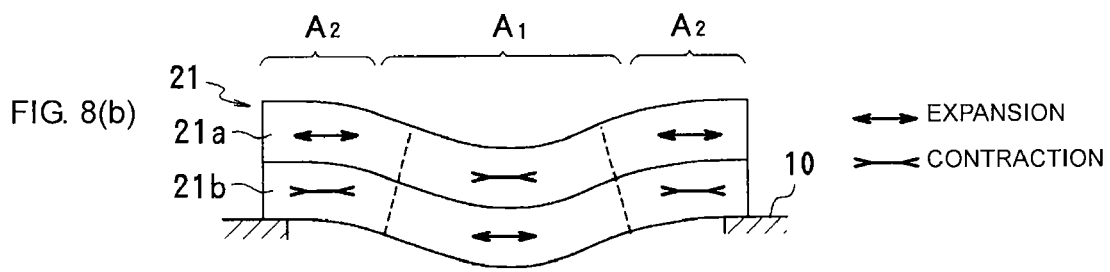
FIG. 8(b)
FIG. 9
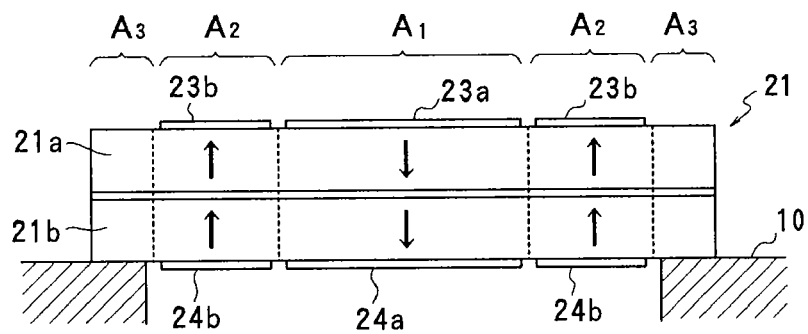
FIG. 10
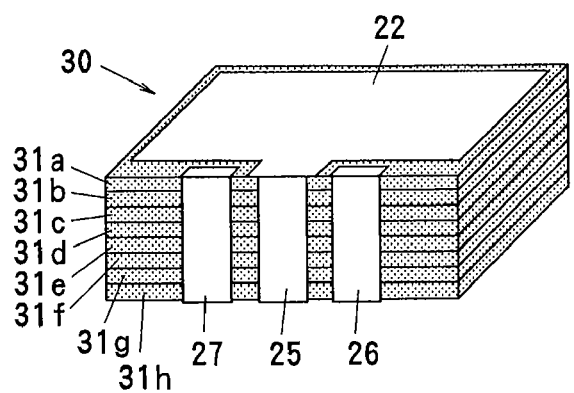

FIG. 21(a) DURING POLARIZATION
FIG. 21(b) DURING DRIVING
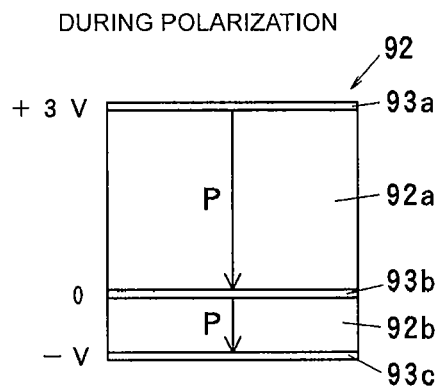
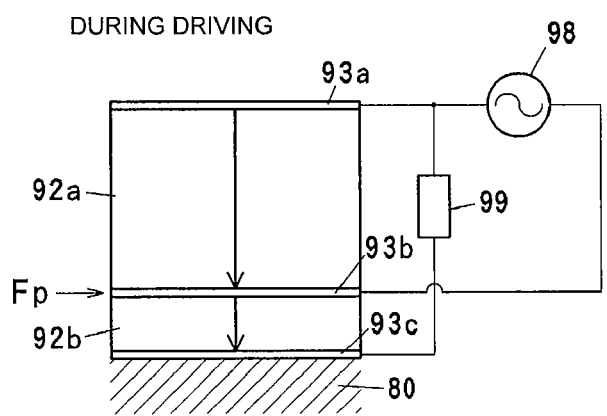
FIG. 22(a) DURING POLARIZATION
FIG. 22(b) DURING DRIVING
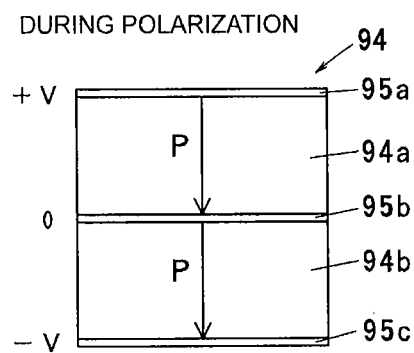
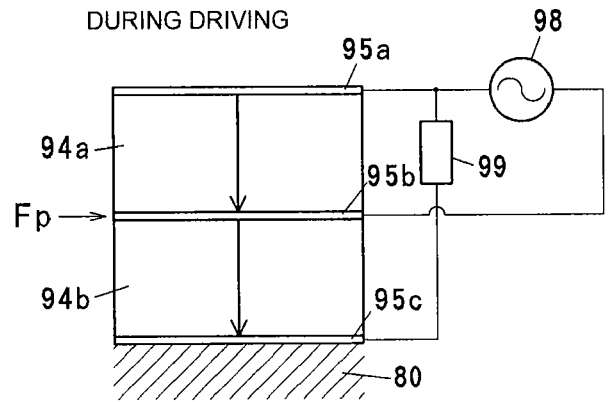
FIG. 23(a) DURING POLARIZATION
FIG. 23(b) DURING DRIVING
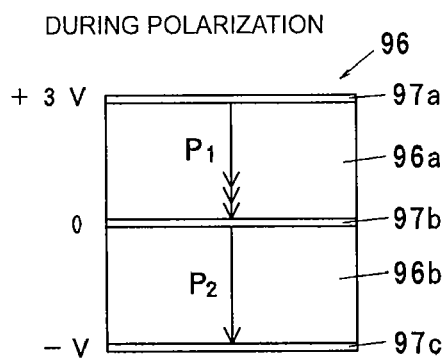
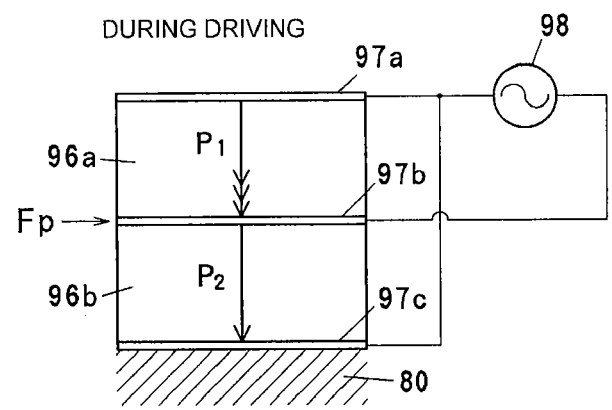

↔ EXPANSION
>< CONTRACTION
P DIRECTION OF POLARIZATION
E DIRECTION OF ELECTRIC FIELD

PIEZOELECTRIC PUMP

CROSS REFERENCE TO RELATED APPLICATIONS

The present application is a continuation of International Application No. PCT/JP2007/063645, filed Jul. 9, 2007, which claims priority to Japanese Patent Application No. JP2006-190176, filed Jul. 11, 2006, the entire contents of each of these applications being incorporated herein by reference in their entirety.

FIELD OF THE INVENTION

The present invention relates to piezoelectric pumps, and more specifically, relates to piezoelectric pumps including piezoelectric elements to be bent.

BACKGROUND OF THE INVENTION

Piezoelectric pumps including pump bodies with pump chambers and piezoelectric elements fixed to the pump bodies so as to close openings of the pump chambers and bent by voltage application so as to change the volumes of the pump chambers are well known. Examples of such piezoelectric elements include unimorph cells and bimorph cells, and both types of cells have a disadvantage that they cannot achieve a sufficient discharge flow rate since the peripheral portions of the piezoelectric elements are fixed to pump bodies and the positions of the central portions of the piezoelectric elements cannot be significantly changed.

To solve this problem, Patent Document 1 describes a piezoelectric pump including a controllable unimorph film formed of a first layer that can be driven by a piezoelectric effect and a supporting layer joined to the first layer. The film has a peripheral area and a central area, both of them being driven by a piezoelectric effect, and is controlled such that the central area is expanded when the peripheral area is contracted in lateral directions. In this case, a large displacement can be achieved at the central portion of the film even when the film is firmly supported by a pump body at the peripheral portion thereof since directions of displacement are opposite to each other in the central portion and the peripheral portion. As a result, a high discharge flow rate can be achieved.
Patent Document 1: Japanese Unexamined Patent Application Publication (Translation of PCT Application) No. 1-500892

To solve the above-described problem, Patent Document 2 describes a piezoelectric pump including a bimorph cell serving as a piezoelectric element. The piezoelectric element has central electrodes and peripheral electrodes supported by a pump body, the electrodes being separated from each other, and AC voltages having polarities opposite to each other are applied to the central electrodes and the peripheral electrodes. In this case, a displacement larger than that achieved by the piezoelectric pump described in Patent Document 1 can be achieved since the piezoelectric element has a bimorph structure including two piezoelectric bodies bonded to each other.
Patent Document 2: Japanese Unexamined Patent Application Publication No. 3-54383

FIG. 27 illustrates the piezoelectric element and a driving circuit for the piezoelectric element described in Patent Document 2. In FIG. 27, a piezoelectric element 100 includes two piezoelectric bodies 101 and 102 bonded to each other with a metal plate 103 interposed therebetween and electrodes formed on the top and bottom surfaces of the laminate. The electrode on the top surface includes a peripheral electrode portion 104 and a central electrode portion 105, and the electrode on the bottom surface includes a peripheral electrode portion 106 and a central electrode portion 107. One end of an AC power source 108 is connected to the metal plate (common electrode) 103. The other end of the AC power source 108 is connected to the peripheral electrode portions 104 and 106 via a controller 109, and further connected to the central electrode portions 105 and 107 via an inverter 110. The entire piezoelectric bodies 101 and 102 are polarized in the same direction as indicated by arrows P.

As is clear from FIG. 27, the metal plate 103 is at a ground potential, and the phase of a voltage applied to the peripheral electrode portions 104 and 106 is shifted from that of a voltage applied to the central electrode portions 105 and 107 by 180°. The direction of an electric field E in the central portion of each piezoelectric body is opposite to that of an electric field E in the peripheral portion of the corresponding piezoelectric body. The electric fields E acting between the metal plate 103 and the electrodes on the top and bottom surfaces can expand or contract the central and peripheral portions of the piezoelectric bodies 101 and 102. The piezoelectric bodies are contracted when the directions of the electric fields and those of polarization are the same, and are expanded when the directions of the electric fields and those of polarization are opposite to each other. As a result, the directions of the displacement of the piezoelectric element 100 become opposite to each other in the central portion and the peripheral portion as described above, and a large displacement can be achieved at the central portion of the piezoelectric element 100 even when the peripheral portion of the piezoelectric element 100 is fixed to a pump body.

Since the above-described piezoelectric element 100 includes the two fired and polarized piezoelectric bodies 101 and 102 bonded to each other with the metal plate 103 interposed therebetween, the thickness of each piezoelectric body is large, and a high driving voltage is required for a desired displacement. The high driving voltage requires a large driving circuit, which is not preferable with consideration of installation of the piezoelectric pump in, in particular, portable devices. Moreover, short-circuits may occur by migration since the potentials of the peripheral electrode portions and the central electrode portions that are adjacent to each other in the same planes differ from each other. When the size of the piezoelectric element is reduced so as to correspond to a smaller piezoelectric pump, gaps for electrically separating the peripheral electrode portions and the central electrode portions are correspondingly reduced, resulting in an increase in the risk of short-circuits. Furthermore, since the potentials of the central portion and the peripheral portion are inverted during driving, it is necessary to apply three different voltages to the intervening metal plate 103, the peripheral electrode portions 104 and 106, and the central electrode portions 105 and 107. Therefore, it is necessary to extend a plurality of wiring lines from each layer, resulting in complication of wiring and complication of the driving circuit, for example, installation of the inverter 110.

SUMMARY OF THE INVENTION

Accordingly, an object of preferred embodiments of the present invention is to provide a piezoelectric pump capable of generating a large displacement at a central portion of a piezoelectric element even when a driving voltage is relatively low and preventing short-circuits caused by migration.

To achieve the above-described object, the present invention provides a piezoelectric pump including a pump body with a pump chamber and a piezoelectric element supported by the pump body so as to close the pump chamber and bent by voltage application so as to change the volume of the pump chamber. The piezoelectric element has a central area and a peripheral area surrounding the central area at a portion corresponding to the pump chamber, and the central area and the peripheral area are bent in opposite directions in accordance with driving voltages applied to the piezoelectric element. The piezoelectric element is formed by laminating a plurality of piezoelectric layers with electrodes interposed therebetween, firing the laminate, and polarizing the laminate. The central area and the peripheral area of each of the piezoelectric layers are polarized opposite to each other in the thickness direction. The electrodes are formed such that driving electric fields oriented in the same direction in the thickness direction are applied to the central area and the peripheral area of each of the piezoelectric layers. Driving voltages at the same potential are applied to the electrodes formed in the same planes of the piezoelectric layers.

The piezoelectric element used for the piezoelectric pump of the present invention is a laminate including a plurality of piezoelectric layers. That is, the piezoelectric element is formed by laminating and pressing piezoelectric ceramic layers in a state of green sheets with electrodes interposed therebetween, firing the laminate, and polarizing the laminate. Therefore, the piezoelectric element can be reduced in thickness and can be driven by lower voltage compared with known piezoelectric elements of the bimorph type having two fired piezoelectric plates bonded to each other with a metal plate interposed therebetween. As a result, a small pump driven by low voltage can be realized. The central area and the peripheral area of each of the piezoelectric layers are polarized opposite to each other in the thickness direction so that the central area and the peripheral area of the piezoelectric element are bent in opposite directions, and the electrodes are formed such that driving electric fields oriented in the same direction in the thickness direction are applied to the central area and the peripheral area of each of the piezoelectric layers. Furthermore, since driving voltages at the same potential are applied to the electrodes formed in the same planes of the piezoelectric layers, short-circuits between the electrodes caused by migration can be prevented even when a plurality of electrodes are formed in the same planes. This leads to stable operation for a long period of time.

When the piezoelectric element has the simplest structure including two piezoelectric layers, for example, the central area and the peripheral area of each of the piezoelectric layers can be polarized opposite to each other in the thickness direction, and the piezoelectric layers adjacent to each other can be polarized in the same directions. Application of driving electric fields oriented in the same direction in the thickness direction to the central area and the peripheral area of each of the piezoelectric layers in this state causes, for example, contraction of the central area of the upper piezoelectric layer, expansion of the central area of the lower piezoelectric layer, expansion of the peripheral area of the upper piezoelectric layer, and contraction of the peripheral area of the lower piezoelectric layer. As a result, the directions of the displacement of the piezoelectric element become opposite to each other in the central portion and the peripheral portion, and a large displacement can be achieved at the central portion of the piezoelectric element even when the piezoelectric element is firmly supported by the pump body at the peripheral portion thereof.

According to a preferred embodiment of the present invention, the electrodes can include split electrodes split so as to correspond to the central area and the peripheral area and continuous electrodes extending over the central area and the peripheral area, and the split electrodes and the continuous electrodes can be alternately disposed in a direction along which the piezoelectric layers are laminated. In this case, the continuous electrodes can be formed on every second layer, and warpage of the piezoelectric bodies caused by difference in level between the electrodes and gaps can be prevented. Moreover, this structure can be easily applied to piezoelectric elements of the multilayer type including two or more layers, and the driving voltage can be reduced.

The split electrodes and the continuous electrodes are not necessarily disposed in a regularly alternate manner. Two or more continuous electrodes can be disposed between two split electrodes adjacent to each other in the layer laminating direction, and an intermediate layer that is not bent spontaneously can be disposed between the two or more continuous electrodes. For example, in a case where two continuous electrodes are formed between two split electrodes adjacent to each other in the thickness direction of the piezoelectric element, the piezoelectric layer interposed between the two continuous electrodes serves as an intermediate layer that does not expand or contract even when driving voltages are applied to the electrodes. When the piezoelectric layers at one side of the intermediate layer and those at the other side of the intermediate layer expand or contract in opposite directions, the intermediate layer relieves stress generated between the two piezoelectric layers, and the piezoelectric element can be efficiently bent.

According to a preferred embodiment of the present invention, the split electrodes can each include a central electrode portion formed at a position corresponding to the central area, a peripheral electrode portion formed at a position corresponding to the peripheral area and surrounding the central electrode portion with a gap interposed therebetween, and an extension electrode portion extending from the central electrode portion to the outer periphery of the piezoelectric layers so as to cross the peripheral electrode portion. The piezoelectric element can include a first piezoelectric portion and a second piezoelectric portion disposed in the layer laminating direction, the piezoelectric portions expanding or contracting in opposite directions when driving voltages are applied. The piezoelectric element can include a first connecting electrode and a second connecting electrode formed at the outer periphery thereof, the first connecting electrode connecting the extension electrode portions extending from the central electrode portions formed between the piezoelectric layers in the first piezoelectric portion and the peripheral electrode portions formed between the piezoelectric layers in the second piezoelectric portion, the second connecting electrode connecting the peripheral electrode portions formed between the piezoelectric layers in the first piezoelectric portion and the extension electrode portions extending from the central electrode portions formed between the piezoelectric layers in the second piezoelectric portion.

When the central electrode portions are surrounded by the peripheral electrode portions, it is necessary to extend the central electrode portions outside the peripheral portions. When the central electrode portions are extended using, for example, lead wires as described in Patent Document 2, the lead wires are connected to portions to be vibrated, and may block the vibration of the piezoelectric element. In addition, when the continuous electrode disposed at the middle position in the thickness direction is at the ground potential and voltages having different polarities are applied to the peripheral electrode portions and the central electrode portions of the split electrodes as described in Patent Document 2, it is necessary to extend a plurality of lead wires from each layer, resulting in complication of wiring. In contrast, when the extension electrode portions extend from the central electrode portions to the outer periphery of the piezoelectric layers so as to cross the peripheral electrode portions, when the piezoelectric element includes the first piezoelectric portion and the second piezoelectric portion disposed in the layer laminating direction, the piezoelectric portions expanding or contracting in opposite directions when driving voltages are applied, when the extension electrode portions extending from the central electrode portions formed between the piezoelectric layers in the first piezoelectric portion and the peripheral electrode portions formed between the piezoelectric layers in the second piezoelectric portion are connected to each other via the first connecting electrode, and when the peripheral electrode portions formed between the piezoelectric layers in the first piezoelectric portion and the extension electrode portions extending from the central electrode portions formed between the piezoelectric layers in the second piezoelectric portion are connected to each other via the second connecting electrode, it is not necessary to change the shapes of the electrodes during polarization and during driving, and wiring, the polarization circuit, and the driving circuit can be simplified. That is, the piezoelectric element having a layered structure can be easily polarized by, for example, connecting the continuous electrodes to a ground, applying a positive DC voltage to the central electrode portions in the first piezoelectric portion and the peripheral electrode portions in the second piezoelectric portion, and applying a negative DC voltage to the peripheral electrode portions in the first piezoelectric portion and the central electrode portions in the second piezoelectric portion during polarization. A desired displacement in which the directions of displacement are opposite to each other in the central portion and the peripheral portion can be achieved by, for example, connecting the continuous electrodes to a ground and applying alternating voltages at the same potential to the central electrode portions and the peripheral electrode portions in both the piezoelectric portions during driving. That is, only two driving voltages suffice, and no inverter is required, resulting in a simplified driving circuit. Herein, alternating voltages can include rectangular-wave voltages in place of AC voltages.

The connecting electrodes can be end-face electrodes formed at outer peripheral surfaces of the piezoelectric layers, or can be via conductors or through-holes passing through the piezoelectric layers in the thickness direction. When the piezoelectric element is supported by the pump body at the outer peripheral portion on which the connecting electrodes are formed, a highly reliable connection without blocking vibration, breaking of wires, and fatigue can be achieved. Moreover, when the piezoelectric element is bonded to a diaphragm, electrodes on the bonding surface can be extended to an outer edge of the piezoelectric element via extension electrode portions. Thus, reliability of bonding to the diaphragm is improved. The electrode extension structure according to this embodiment can be easily applied to piezoelectric elements of the multilayer type including two or more layers having the same electrode patterns.

When the first piezoelectric portion and the second piezoelectric portion each include a plurality of laminated piezoelectric layers, the central electrode portions formed between the piezoelectric layers in the first piezoelectric portion are preferably connected to each other, the peripheral electrode portions formed between the piezoelectric layers in the first piezoelectric portion are preferably connected to each other, the central electrode portions formed between the piezoelectric layers in the second piezoelectric portion are preferably connected to each other, and the peripheral electrode portions formed between the piezoelectric layers in the second piezoelectric portion are preferably connected to each other. Also in this case, the connecting electrodes as described above can be used for connecting the central electrode portions to each other and the peripheral electrode portions to each other. With this, wiring, the polarization circuit, and the driving circuit can be simplified.

According to a preferred embodiment of the present invention, the piezoelectric element can have a neutral area that is not bent spontaneously formed outside the peripheral area adjacent to the outer periphery, and can be supported by the pump body at the neutral area. When a piezoelectric element of the bimorph type is supported by a pump body at the vibrating area thereof, portions to be bent are forcedly restrained. This causes waste of electrical energy, and may cause pressure leakage from a gap formed between the piezoelectric element and the pump body. In contrast, when the piezoelectric element is supported by the pump body at the neutral area as described above, the piezoelectric element can be efficiently bent, and pressure leakage from a gap formed between the piezoelectric element and the pump body can be prevented. Herein, the neutral area refers to a portion in which electrodes at different potentials are not formed so as to face each other, or a portion in which electrodes that are at different potentials but not polarized are formed so as to face each other. Such an area is not bent spontaneously even when driving voltages are applied.

The piezoelectric layers can be rectangular, the central electrode portions can be circular, and the peripheral electrode portions can be ring-shaped concentric with the central electrode portions. Both the central electrode portions and the peripheral electrode portions can have rectangular shapes as those described in Patent Document 2. In this case, the largest displacement can be achieved. However, stress becomes concentrated in corners of the electrode portions. This may affect durability of the piezoelectric element, and may cause, for example, cracking. According to this embodiment, stress concentration is low since the central electrode portions and the peripheral electrode portions are circular, and the durability of the piezoelectric element can be improved. On the other hand, the piezoelectric layers whose outside shape is rectangular can be easily produced and processed as in the case of cutting from large-sized laminated substrates. As a result, the yield from a material is high.

According to a preferred embodiment of the present invention, a diaphragm for separating the piezoelectric element from the pump chamber can be bonded to a surface of the piezoelectric element adjacent to the pump chamber in face-to-face relationship. The diaphragm can be a metal plate, a glass epoxy board, a resin sheet, or a rubber sheet, or can be surface-treated or resin-coated. The diaphragm prevents liquid inside the pump chamber from coming into direct contact with the piezoelectric element, and can be used as a protective layer for preventing liquid leakage.

According to a preferred embodiment of the present invention, a piezoelectric pump includes a pump body with a pump chamber and a piezoelectric element supported by the pump body so as to close the pump chamber and bent by voltage application so as to change the volume of the pump chamber. The piezoelectric element is of the bimorph type in which a plurality of piezoelectric layers are laminated. A diaphragm for separating the piezoelectric element from the pump chamber is bonded to a surface of the piezoelectric element adjacent to the pump chamber in face-to-face relationship. An inversion plane of the piezoelectric element alone, expansion/contraction directions of the piezoelectric element being inverted at the inversion plane, matches a neutral plane of the piezoelectric element and the diaphragm bonded to each other.

When the strength of driving voltages applied to the piezoelectric element alone and the degree of polarization of the piezoelectric element are uniform in the piezoelectric element of the bimorph type alone, the displacement can be maximized by, for example, setting the inversion plane at the middle position in the thickness direction. However, when the inversion plane is set at the middle position in the thickness direction of the piezoelectric element in the case where the piezoelectric element of the bimorph type is bonded to the diaphragm, the displacement cannot be maximized. This is because the neutral plane of the entire diaphragm is shifted from the inversion plane of the piezoelectric element since the piezoelectric element is bonded to the diaphragm. Therefore, a part of the piezoelectric element moves so as to interfere with the displacement, and the displacement is reduced. With this, the pump efficiency is impaired, and unnecessary heat is generated. According to this embodiment, the above-described problems are solved by matching the inversion plane of the piezoelectric element alone with the neutral plane of the piezoelectric element and the diaphragm bonded to each other, and the displacement is maximized. The piezoelectric element according to this embodiment is not limited to those in which the peripheral areas and the central areas are bent in opposite directions as described above, and can be of the typical bimorph type. Moreover, the piezoelectric element is not limited to those having a layered structure, and can include a plurality of single-plate piezoelectric elements bonded to each other.

The inversion plane of the piezoelectric element alone refers to a boundary plane between a side to be expanded and a side to be contracted in the thickness direction of the piezoelectric element when driving voltages are applied to the piezoelectric element alone. Specifically, the inversion plane is a boundary plane between a portion in which the direction of polarization and that of an electric field during driving are the same and a portion in which the direction of polarization and that of an electric field during driving are opposite to each other. When the strength of driving voltages applied to the piezoelectric element alone and the degree of polarization of the piezoelectric element alone are uniform, the inversion plane of the piezoelectric element alone corresponds to the neutral plane of the piezoelectric element alone, that is, a plane at which the compressive/tensile stress is zero. The neutral plane of the entire diaphragm corresponds to a plane at which the compressive/tensile stress is zero in a structure including the piezoelectric element and the diaphragm when the entire diaphragm to which the piezoelectric element is bonded is bent. Therefore, when the inversion plane of the piezoelectric element alone matches the neutral plane of the entire diaphragm, the stress is brought into balance. In general, the neutral plane of the entire diaphragm is located at a position shifted from the middle position of the piezoelectric element in the thickness direction to the diaphragm. The shift varies in accordance with, for example, the Young's modulus and the thickness of the diaphragm.

In order to match the inversion plane of the piezoelectric element alone with the neutral plane of the entire diaphragm, the thickness of a portion of the piezoelectric element at a side of the inversion plane separated from the diaphragm can be increased compared with the thickness of a portion of the piezoelectric element at the other side of the inversion plane adjacent to the diaphragm, or the number of laminated piezoelectric layers separated from the diaphragm can be increased compared with the number of laminated piezoelectric layers adjacent to the diaphragm in the piezoelectric element. Moreover, the inversion plane of the piezoelectric element alone can match the neutral plane of the entire diaphragm without shifting the position of the inversion plane of the piezoelectric element alone from the middle position of the piezoelectric element to the diaphragm in some cases. That is, the strength of an electric field of a driving voltage applied to the piezoelectric layer separated from the diaphragm can be increased compared with the strength of an electric field of a driving voltage applied to the piezoelectric layer adjacent to the diaphragm in the piezoelectric element, or the degree of polarization of the piezoelectric layer separated from the diaphragm can be increased compared with the degree of polarization of the piezoelectric layer adjacent to the diaphragm in the piezoelectric element.

According to the present invention, a large displacement can be achieved at the central portion of a piezoelectric element even when the piezoelectric element is supported by a pump body at the peripheral portion thereof since the central area and the peripheral area of the piezoelectric element are bent in opposite directions. As a result, the maximum discharge volume can be increased. In particular, since the piezoelectric element is a laminate including a plurality of piezoelectric layers, the piezoelectric element can be reduced in thickness and can be driven by lower voltage due to the multilayered structure. As a result, a small and power-saving pump can be realized. Moreover, the potentials of the peripheral electrode portions and the central electrode portions adjacent to each other in the same planes are the same since voltages at the same potential are applied to the electrode portions formed in the same planes of each of the piezoelectric layers constituting the piezoelectric element. With this, short-circuits caused by migration can be prevented.

According to another feature of the present invention, a piezoelectric element of the bimorph type is bonded to a diaphragm in face-to-face relationship, and an inversion plane of the piezoelectric element alone, expansion/contraction directions of the piezoelectric element being inverted at the inversion plane, matches a neutral plane of the piezoelectric element and the diaphragm bonded to each other. Therefore, no part of the piezoelectric element moves so as to interfere with the displacement of the entire diaphragm, and the displacement is increased. With this, the pump efficiency can be improved, and unnecessary heat is reduced.

BRIEF DESCRIPTION OF DRAWINGS

FIG. 6 (a) - 6 (c) illustrates electrode patterns on each layer of the piezoelectric element shown in FIG. 4.

FIG. 7 is a circuit diagram illustrating a method for polarizing the piezoelectric element shown in FIG. 4.

FIGS. 8(a) and 8(b) illustrate a method for driving the piezoelectric element shown in FIG. 4 and displacement of the piezoelectric element, respectively.

FIG. 9 is a schematic cross-sectional view of the piezoelectric element when the piezoelectric element has a neutral area at the outer peripheral portion thereof.

FIG. 10 is a perspective view of a piezoelectric element according to a second embodiment.

FIGS. 21(a) and 21(b) are schematic cross-sectional views during polarization and during driving, respectively, when the thickness of each layer of the piezoelectric element is changed.

FIGS. 22(a) and 22(b) are schematic cross-sectional views during polarization and during driving, respectively, when the strength of an electric field applied to each layer of the piezoelectric element is changed.

FIGS. 23(a) and 23(b) are schematic cross-sectional views during polarization and during driving, respectively, when the degree of polarization of each layer of the piezoelectric element is changed.

REFERENCE NUMERALS

Figure 1:
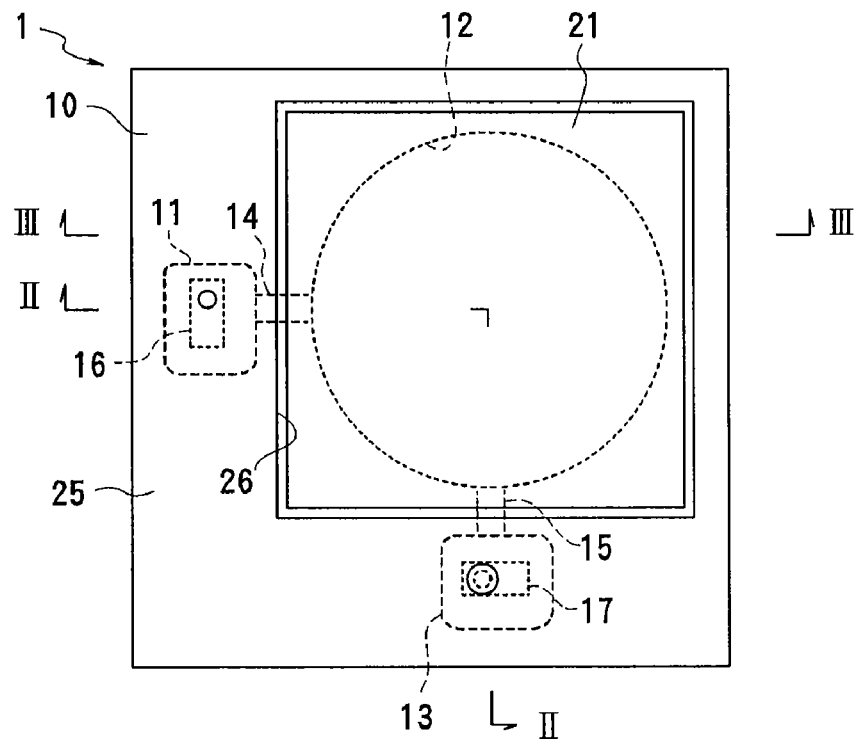
FIG. 1 is a plan view illustrating the entire piezoelectric pump according to a first embodiment of the present invention.

A1 central area
A2 peripheral area
10 pump body
12 pump chamber
11 inlet valve chest
13 outlet valve chest
16 inlet check valve
17 outlet check valve
20 diaphragm
21 piezoelectric element
21a and 21b piezoelectric layers
22 interlayer electrode
23a and 24a central electrode portions
23b and 24b peripheral electrode portions

DETAILED DESCRIPTION OF THE INVENTION

[First Embodiment]

Figure 2:
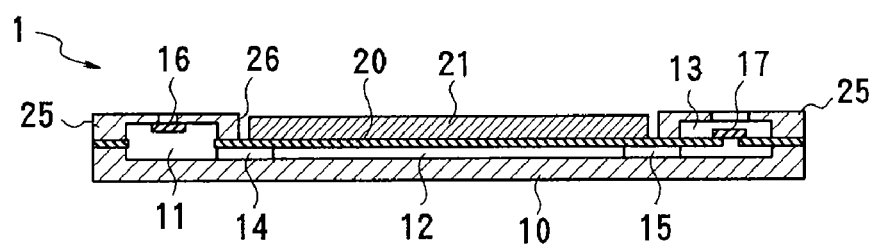
FIG. 2 is a cross-sectional view of the piezoelectric pump taken along line II-II in FIG. 1.
Figure 3:
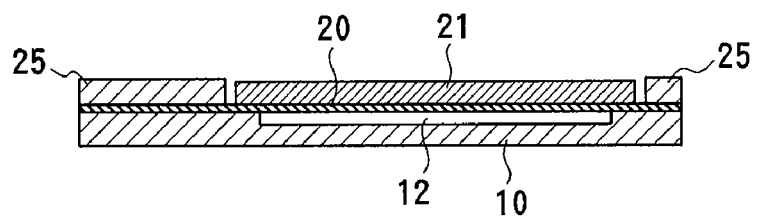
FIG. 3 is a cross-sectional view of the piezoelectric pump taken along line III-III in FIG. 1.
Figure 4:
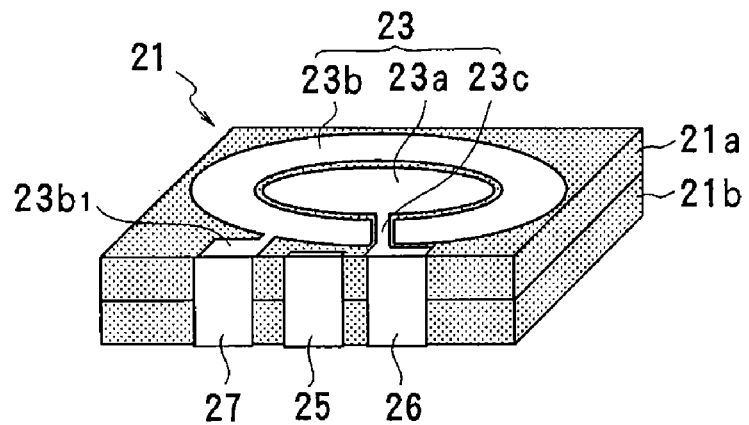
FIG. 4 is a perspective view of a piezoelectric element used for the piezoelectric pump shown in FIG. 1.
Figure 5:
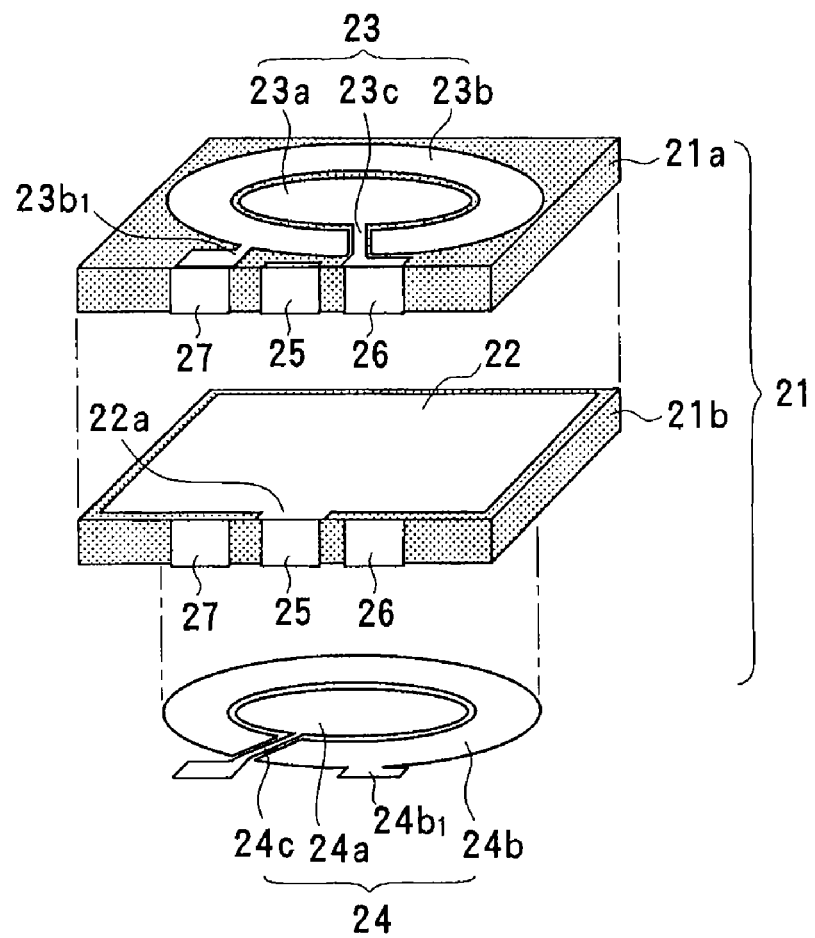
FIG. 5 is an exploded perspective view of the piezoelectric element shown in FIG. 4.
Figure 11:
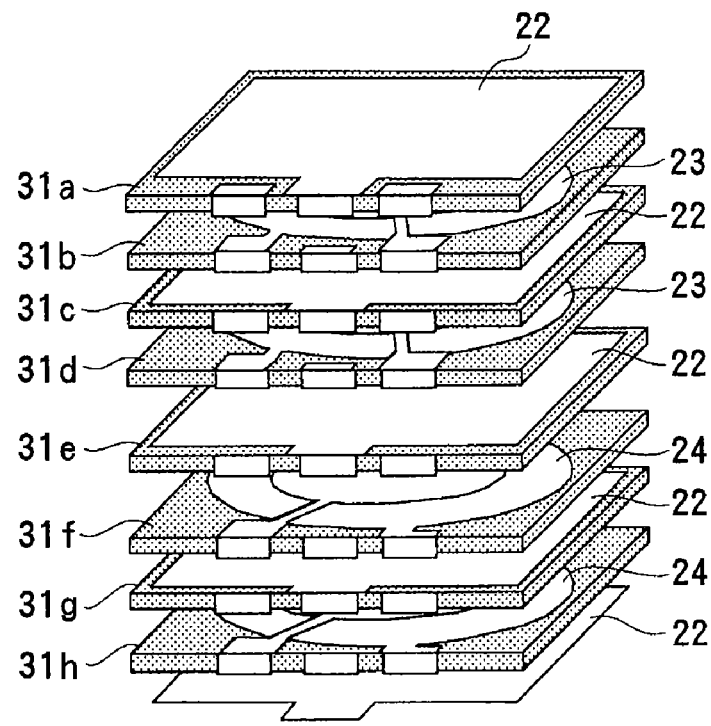
FIG. 11 is an exploded perspective view of the piezoelectric element shown in FIG. 10.

A piezoelectric pump according to a first embodiment of the present invention will now be described with reference to FIGS. 1 to 3. FIG. 1 is a plan view illustrating the entire piezoelectric pump. FIG. 2 is a cross-sectional view taken along line II-II in FIG. 1. FIG. 3 is a cross-sectional view taken along line III-III in FIG. 1.

This piezoelectric pump 1 includes a pump body 10, a diaphragm 20, a piezoelectric element 21, and a retaining plate 25. The pump body 10 is composed of metal or a high-rigidity material such as resin. An inlet valve chest 11, a pump chamber 12, and an outlet valve chest 13 are formed between the pump body 10 and the retaining plate 25, and are connected to each other via connecting channels 14 and 15. An inlet check valve 16 is disposed in the inlet valve chest 11. The inlet check valve 16 allows passage of fluid flowing from an inlet port to the inlet valve chest 11, and blocks fluid flowing in the opposite direction. An outlet check valve 17 is disposed in the outlet valve chest 13. The outlet check valve 17 allows passage of fluid flowing from the pump chamber 12 to the outlet valve chest 13, and blocks fluid flowing in the opposite direction.

The pump chamber 12 is a flat space having a depth smaller than the length and the width thereof. One of the surfaces of the pump chamber is closed by the diaphragm 20, and the other surfaces are enclosed by the pump body 10 formed of a rigid body. The pump body 10 can be composed of metal or resin. Although the pump chamber 12 herein is circular when viewed in plan, the pump chamber can be rectangular.

The diaphragm 20 formed of an elastic thin plate extends over substantially the entire top surface of the pump body 10, and is fixed between the pump body and the retaining plate 25 by bonding. The material of the diaphragm 20 is not specified. However, a thin plate composed of a material with a relatively low Young's modulus such as glass epoxy, resin, and rubber is preferable. The piezoelectric element 21 is bonded on the diaphragm 20 in face-to-face relationship. The area of a surface of the piezoelectric element 21 perpendicular to a direction along which the piezoelectric element is bent is larger than that of a surface of the pump chamber 12 perpendicular to a direction along which the volume of the pump chamber is changed, and the outer peripheral portion of the piezoelectric element 21 is bonded to the surface of the pump body 10 opposing the piezoelectric element with the diaphragm 20 interposed therebetween. That is, the entire pump chamber 12 is covered with the piezoelectric element 21. The diaphragm 20 in this embodiment functions as a gasket for preventing liquid from leaking from the pump chamber 12 and as a protective sheet for preventing the liquid inside the pump chamber 12 from coming into contact with the piezoelectric element 21. The retaining plate 25 has an opening 26 formed at a position corresponding to that of the piezoelectric element 21, and the rear surface of the piezoelectric element 21 is left open.

Although the piezoelectric pump in the above-described example is provided with the diaphragm 20, this is not meant to exclude a case where the piezoelectric pump is not provided with the diaphragm 20 as a matter of course. Only the piezoelectric element 21 can be disposed on substantially the entire top surface of the pump body 10 so as to function as a lid of the pump body. In this case, it is preferable that the thickness of a portion corresponding to the lid of the pump chamber 12, i.e., the piezoelectric element 21, and the thickness of a portion of the pump body 10 corresponding to the bottom of the pump chamber 12 are substantially the same. With this structure, the generated pressure can be maximized even when the piezoelectric pump is small and has a low profile having a thickness of, for example, 1 mm. Normally, the generated pressure is also affected by the Young's moduli of the portions corresponding to the lid and the bottom of the pump chamber 12. However, when the thicknesses of the portions corresponding to the lid and the bottom of the pump chamber 12 are substantially the same, the generated pressure can be substantially maximized even when there is a small difference between the Young's moduli of the portions corresponding to the lid and the bottom of the pump chamber 12.

FIGS. 4, 5 and 6(a) to 6(b) illustrate an example of a specific structure of the piezoelectric element 21. The piezoelectric element 21 has a bimorph structure including two laminated piezoelectric layers 21a and 21b composed of a piezoelectric ceramic, and has a quadrangular shape on the whole. Specifically, the piezoelectric ceramic layers 21a and 21b in a state of two green sheets are laminated and pressed with an interlayer electrode 22 serving as a continuous electrode interposed therebetween. The laminate is then fired, and polarized after electrodes 23 and 24 are formed on the top and bottom surfaces. FIG. 6(a) illustrates an electrode pattern on the top surface, FIG. 6(b) illustrates an electrode pattern of the interlayer electrode, and FIG. 6(c) illustrates an electrode pattern on the bottom surface.

The interlayer electrode 22 has a quadrangular shape that covers substantially the entire piezoelectric layers 21a and 21b except for a narrow edge portion. The interlayer electrode 22 extends to outer edges of the piezoelectric layers via a portion of extension 22a, and is connected to an end-face electrode 25 serving as an example of connecting electrodes formed at outer peripheral surfaces of the piezoelectric layers. The electrode 23 on the top surface includes a circular central electrode portion 23a, a peripheral electrode portion 23b concentrically surrounding the central electrode portion with a gap interposed therebetween, and an extension electrode portion 23c extending from the central electrode portion 23a to an outer edge of the piezoelectric layer so as to cross the peripheral electrode portion 23b in a radial direction. The extension electrode portion 23c is connected to an end-face electrode 26 serving as an example of the connecting electrodes formed at the outer peripheral surfaces of the piezoelectric layers, and the peripheral electrode portion 23b is connected to an end-face electrode 27 serving as an example of the connecting electrodes formed at the outer peripheral surfaces of the piezoelectric layers via an extension 23b1. The electrode 24 on the bottom surface includes a circular central electrode portion 24a, a peripheral electrode portion 24b concentrically surrounding the central electrode portion with a gap interposed therebetween, and an extension electrode portion 24c extending from the central electrode portion 24a to an outer edge of the piezoelectric layer so as to cross the peripheral electrode portion 24b in a radial direction. The extension electrode portion 24c is formed at a position so as not to face the extension electrode portion 23c of the top-face electrode 23. The extension electrode portion 24c is connected to the end-face electrode 27, and the peripheral electrode portion 24b is connected to the end-face electrode 26 via an extension 24b1. In this example, all the end-face electrodes 25 to 27 are formed at one of the end faces of the piezoelectric element 21. However, the end-face electrodes can be formed at, for example, different end faces as a matter of course. Moreover, in this example, the end-face electrode 25 connected to the interlayer electrode 22 is formed between the end-face electrodes 26 and 27. However, the order of formation and the positions of the electrodes can be changed as a matter of course. Furthermore, the number of the end-face electrodes 25 to 27 is preferably reduced in view of the ease of wiring. However, when a complicated wiring is acceptable, additional wiring lines other than the electrodes 25 to 27 can be formed. Moreover, via conductors or through-holes can be used for the connection instead of the end-face electrodes 25 to 27.

The piezoelectric element 21 has a central area and a peripheral area bent in opposite directions. The central area is defined by the central electrode portions 23a and 24a, and the peripheral area is defined by the peripheral electrode portions 23b and 24b. The interlayer electrode 22 serves as a continuous electrode (solid electrode) extending over the central area and the peripheral area. When the border of the two piezoelectric layers 21a and 21b of the piezoelectric element 21 expanded or contracted in opposite directions is defined as Fp, the border Fp is located at the position of the interlayer electrode 22 in this embodiment.

FIG. 7 illustrates an example of electrical wiring during polarization of the piezoelectric element 21. As shown in FIG. 7, the central electrode portion 23a of the top-face electrode 23 and the peripheral electrode portion 24b of the bottom-face electrode 24 are connected to a pole (for example, positive pole) of a DC power source, and the peripheral electrode portion 23b of the top-face electrode 23 and the central electrode portion 24a of the bottom-face electrode 24 are connected to the other pole (for example, negative pole) of the DC power source. The interlayer electrode 22 is connected to a ground. With this, the piezoelectric layers 21a and 21b are polarized in directions indicated by arrows P shown in FIG. 7. That is, the central area A1 and the peripheral area A2 of each of the piezoelectric layers 21a and 21b are polarized opposite to each other in the thickness directions, and corresponding portions in the piezoelectric layers 21a and 21b adjacent to each other are polarized in the same directions. Since the central electrode portion 23a of the top-face electrode 23 and the peripheral electrode portion 24b of the bottom-face electrode 24 are connected to each other via the end-face electrode 26, the peripheral electrode portion 23b of the top-face electrode 23 and the central electrode portion 24a of the bottom-face electrode 24 are connected to each other via the end-face electrode 27, and the interlayer electrode 22 is connected to the end-face electrode 25 as described above, the piezoelectric element can be easily polarized as shown in FIG. 7 by applying DC voltages to these three end-face electrodes 25, 26, and 27.

Moreover, in FIGS. 4, 5 and 6(a) to 6(c), the extensions 23b1 and 24b1 can be extension electrode portions, and the extension electrode portion 23c and the extension 24b1 and the extension electrode portion 24c and the extension 23b1 can extend to corresponding counter corners of the piezoelectric layers 21a and 21b. With this structure, the extension electrode portions are symmetrically formed when the piezoelectric pump is viewed as a whole, and the piezoelectric element can be bent while the balance thereof is maintained compared with the case where all the extension electrode portions are formed at an end face. This leads to a stable drive.

FIGS. 8(a) and 8(b) illustrate an example of electrical wiring and an example of displacement, respectively, during driving of the piezoelectric element 21. The interlayer electrode 22 is connected to the ground side of an AC power source, and the central electrode portion 23a and the peripheral electrode portion 23b of the top-face electrode 23 and the central electrode portion 24a and the peripheral electrode portion 24b of the bottom-face electrode 24 are connected to the driving side of the AC power source. With this, electric fields E oriented from the electrodes 23 and 24 on the top and bottom surfaces toward the interlayer electrode 22 as shown in FIG. 8(a) are generated, and cause contraction of the central area A1 of the upper piezoelectric layer, expansion of the central area A1 of the lower piezoelectric layer, expansion of the peripheral area A2 of the upper piezoelectric layer, and contraction of the peripheral area A2 of the lower piezoelectric layer as shown in FIG. 8(b). When the electric fields E are reversed, the directions of expansion and contraction are reversed from the above-described state. As a result, the central area A1 and the peripheral area A2 of the piezoelectric element 21 are bent in opposite directions, and a large displacement can be achieved at the central portion even when the peripheral portion is firmly supported. Since the potentials of the piezoelectric layers become the same in the same planes during driving, the risk of short-circuits caused by migration is reduced. Furthermore, since the central electrode portion 23a of the top-face electrode 23 and the peripheral electrode portion 24b of the bottom-face electrode 24 are connected to the end-face electrode 26, the peripheral electrode portion 23b of the top-face electrode 23 and the central electrode portion 24a of the bottom-face electrode 24 are connected to the end-face electrode 27, and the interlayer electrode 22 is connected to the end-face electrode 25, the piezoelectric element can be easily bent by applying AC voltages between the end-face electrode 25 and the end-face electrodes 26 and 27. Thus, the wiring can be simplified, resulting in a simple driving circuit.

FIG. 9 illustrates an example of a supporting structure for a piezoelectric element 21 having a neutral area A3 at the outer peripheral portion thereof. In FIG. 8(b), the piezoelectric element is directly supported by the pump body 10 at the peripheral area A2 thereof. However, the neutral area A3 that is not bent can be formed at the outer peripheral portion of the piezoelectric element 21 when the outer edges of the peripheral electrode portions 23b and 24b are located inside the outer edges of the piezoelectric layers as shown in FIGS. 6(a) and 6(c). The peripheral area A2 can be bent more freely when the piezoelectric element is fixed to the pump body 10 at this neutral area A3. With this, the electrical energy loss can be reduced, and separation of the piezoelectric element 21 (diaphragm 20) from the pump body 10 at the interface therebetween and, by extension, liquid leakage can be reduced. Although the diaphragm is not illustrated in FIG. 9 for ease of understanding, the same applies to the case where the diaphragm is bonded to the entire surface of the piezoelectric element 21.

[Second Embodiment]

FIGS. 10 to 13 illustrate a piezoelectric element according to a second embodiment. This piezoelectric element 30 is a laminate including a plurality of (herein eight) piezoelectric layers 31a to 31h each having an electrode of one of the three electrode patterns shown in FIGS. 6(a) to 6(c). The order of the electrode patterns is 6(b), 6(a), 6(b), 6(a), 6(b), 6(c), 6(b), 6(c), and 6(b) from the top. That is, continuous electrodes and split electrodes are alternately disposed in a direction along which the layers are stacked.

Figure 12:
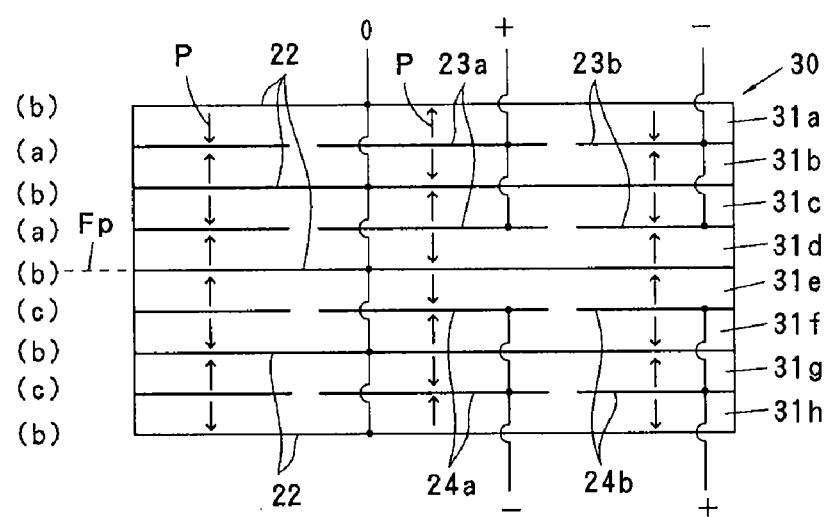
FIG. 12 is a schematic cross-sectional view illustrating the polarization state of each layer of the piezoelectric element shown in FIG. 10.

The piezoelectric layers 31a to 31h are polarized as shown in FIG. 12. That is, the polarization direction in the central area and that in the peripheral area of each of the piezoelectric layers 31a to 31h are opposite to each other. When the piezoelectric layers 31a to 31h are sectioned into a first piezoelectric portion and a second piezoelectric portion whose expansion/contraction directions differ from each other and the border is defined as Fp, two piezoelectric layers adjacent to each other in the thickness direction in the upper four piezoelectric layers 31a to 31d (first piezoelectric portion) located above the border Fp are polarized in opposite directions. Similarly, two piezoelectric layers adjacent to each other in the thickness direction in the lower four piezoelectric layers 31e to 31h (second piezoelectric portion) located below the border Fp are polarized in opposite directions. Only the polarization directions in the two piezoelectric layers 31d and 31e that are located at a central portion in the thickness direction and are adjacent to each other having the border Fp interposed therebetween are the same. During polarization, for example, continuous electrodes 22 are connected to a ground, a positive DC voltage is applied to central electrode portions 23a of the upper four layers and peripheral electrode portions 24b of the lower four layers, and a negative DC voltage is applied to peripheral electrode portions 23b of the upper four layers and central electrode portions 24a of the lower four layers as shown in FIG. 12. Specifically, the piezoelectric layers can be polarized in directions shown in FIG. 12 by connecting an end-face electrode 25 to the ground, applying a positive DC voltage to an end-face electrode 26, and applying a negative DC voltage to an end-face electrode 27.

Figure 13:
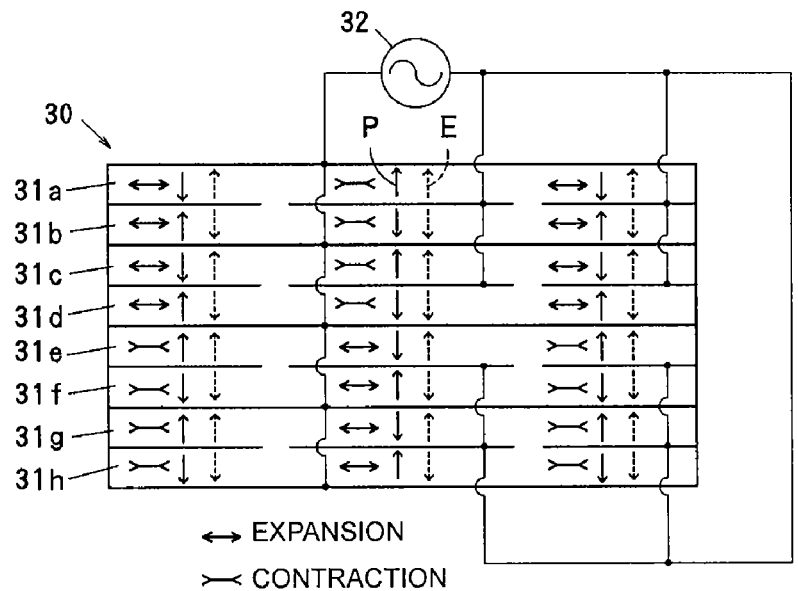
FIG. 13 is a schematic cross-sectional view illustrating a method for driving the piezoelectric element shown in FIG. 10.
Figure 14:
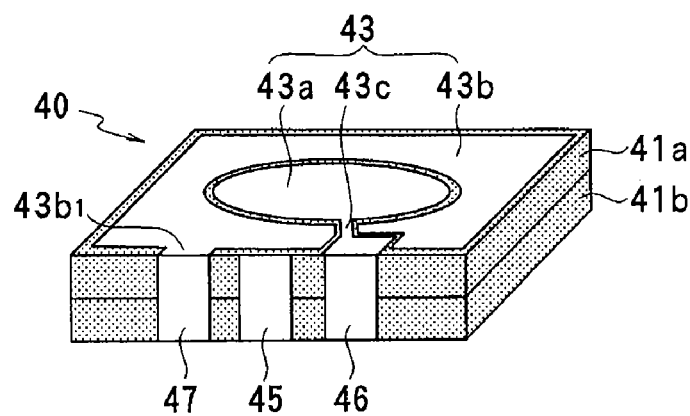
FIG. 14 is a perspective view of a piezoelectric element according to a third embodiment.
Figure 15:
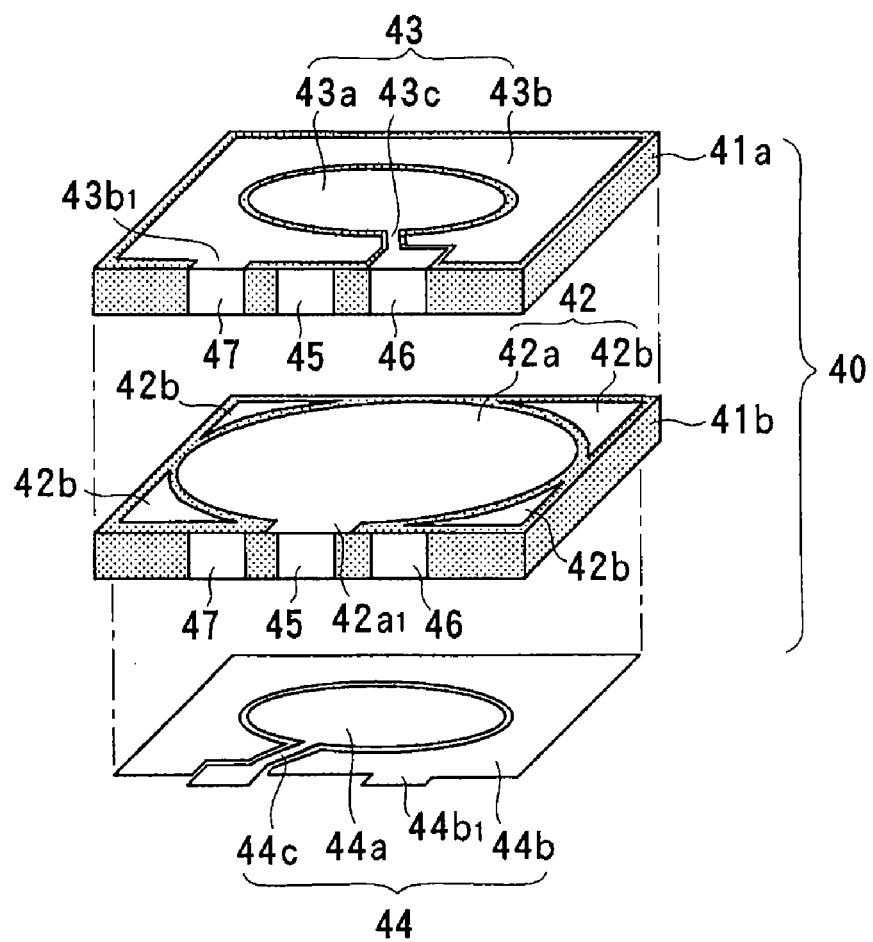
FIG. 15 is an exploded perspective view of the piezoelectric element shown in FIG. 14.

During driving, alternating voltages are applied to the piezoelectric element 30 polarized as above between the interlayer electrode 22 and all the central electrode portions 23a and 24a and the peripheral electrode portions 23b and 24b as shown in FIG. 13. For example, when electric fields E oriented in directions indicated by broken-line arrows are applied, the central areas and the peripheral areas of the piezoelectric layers are expanded or contracted as indicated by double-headed arrows, and the central area and the peripheral area of the piezoelectric element 30 can be bent in opposite directions. When the directions of the electric fields E are reversed, the piezoelectric layers are expanded or contracted in opposite directions from the state shown in FIG. 13. Also in this case, short-circuits caused by migration can be prevented since the potentials of the central electrode portions 23a and the peripheral electrode portions 23b that are adjacent to each other in the same planes are the same and the potentials of the central electrode portions 24a and the peripheral electrode portions 24b that are adjacent to each other in the same planes are the same. Moreover, a desired displacement can be achieved when the potentials of the end-face electrodes 26 and 27 are the same and alternating voltages are applied between the end-face electrode 25 and the end-face electrodes 26 and 27. This can simplify the driving circuit. Since the number of laminated piezoelectric layers in this embodiment is larger than that in the first embodiment, the thickness of each layer can be reduced and the driving voltage can be reduced. The number of piezoelectric layers to be laminated can be arbitrarily selected.

[Third Embodiment]

Figure 16A:
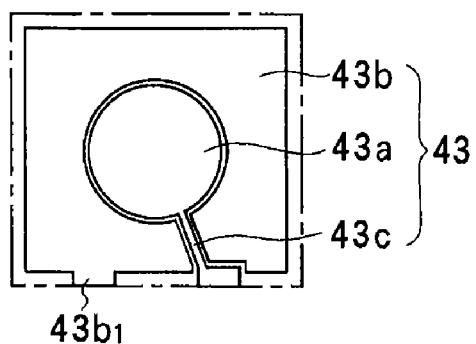
FIG. 16 (a) - 16 (c) illustrates electrode patterns on each layer of the piezoelectric element shown in FIG. 14.
Figure 16B:
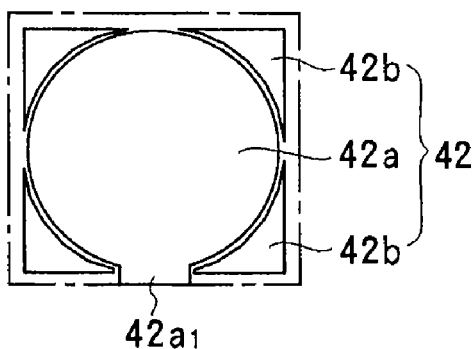
Figure 16C:
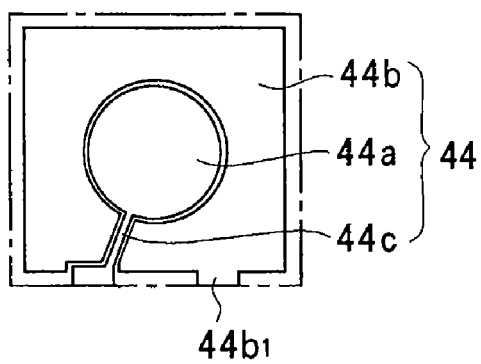

FIGS. 14 and 16(a) to 16(c) illustrate another example of a specific structure of a piezoelectric element. This piezoelectric element 40 includes two laminated piezoelectric layers 41a and 41b composed of a piezoelectric ceramic as that in the first embodiment. That is, the piezoelectric ceramic layers 41a and 41b in a state of two green sheets are laminated and pressed with an interlayer electrode 42 interposed therebetween. The laminate is then fired, and polarized after electrodes 43 and 44 are formed on the top and bottom surfaces. FIG. 16(a) illustrates an electrode pattern on the top surface, FIG. 16(b) illustrates an electrode pattern of the interlayer electrode, and FIG. 16(c) illustrates an electrode pattern on the bottom surface.

The interlayer electrode 42 includes a circular continuous electrode portion 42a and dummy electrode portions 42b formed at four corners around the continuous electrode portion. The circular continuous electrode portion 42a extends to outer edges of the piezoelectric layers via an extension 42a1, and is connected to an end-face electrode 45 formed at outer peripheral surfaces of the piezoelectric layers. The dummy electrode portions 42b are isolated, and are not connected to other electrodes. The electrode 43 on the top surface includes a circular central electrode portion 43a, a peripheral electrode portion 43b surrounding the central electrode portion with a gap interposed therebetween, and an extension electrode portion 43c extending from the central electrode portion 43a to an outer edge of the piezoelectric layer so as to cross the peripheral electrode portion 43b in a radial direction. The extension electrode portion 43c is connected to an end-face electrode 46 formed at the outer peripheral surfaces of the piezoelectric layers, and the peripheral electrode portion 43b is connected to an end-face electrode 47 formed at the outer peripheral surfaces of the piezoelectric layers via an extension 43b1. The electrode 44 on the bottom surface includes a circular central electrode portion 44a, a peripheral electrode portion 44b surrounding the central electrode portion with a gap interposed therebetween, and an extension electrode portion 44c extending from the central electrode portion 44a to an outer edge of the piezoelectric layer so as to cross the peripheral electrode portion 44b in a radial direction. The extension electrode portion 44c and the extension electrode portion 43c of the top-face electrode 43 are formed at different positions in circumferential direction. The extension electrode portion 44c is connected to the end-face electrode 47, and the peripheral electrode portion 44b is connected to the end-face electrode 46 via an extension 44b1. The central electrode portions 43a and 44a are formed so as to be concentric with the continuous electrode portion 42a. The positions of the end-face electrodes 45 to 47 can be arbitrarily changed.

The central area of the piezoelectric element 40 is defined by the central electrode portions 43a and 44a, and the peripheral area is defined by the outer edge of the continuous electrode portion 42a and the inner edges of the peripheral electrode portions 43b and 44b. A neutral area that is not bent spontaneously is formed at the outer peripheral portion of the piezoelectric element 40. In this embodiment, the electrodes 42, 43, and 44 cover the entire piezoelectric layers since the peripheral electrode portion 43b of the top-face electrode 43 and the peripheral electrode portion 44b of the bottom-face electrode 44 extend to the vicinity of the outer portions of the piezoelectric layers and the interlayer electrode 42 includes the dummy electrode portions 42b that cover the outer portions of the piezoelectric layers. With this structure, warpage caused by the presence or absence of the electrodes can be reduced even when the number of piezoelectric layers to be laminated is increased, and cracking during firing, polarization, and driving can be prevented.

Also in this embodiment, the central electrode portion 43a of the top-face electrode 43 and the peripheral electrode portion 44b of the bottom-face electrode 44 are connected to each other via the end-face electrode 46, and the peripheral electrode portion 43b of the top-face electrode 43 and the central electrode portion 44a of the bottom-face electrode 44 are connected to each other via the end-face electrode 47. In addition, the continuous electrode portion 42a is connected to the end-face electrode 45. Therefore, the piezoelectric layers can be polarized as shown in FIG. 7 by connecting the end-face electrode 46 to one of the poles of a DC power source, connecting the end-face electrode 47 to the other pole of the DC power source, and connecting the end-face electrode 45 to a ground during polarization. Moreover, a displacement as shown in FIG. 8(b) can be generated by connecting the end-face electrode 45 to the ground side of an AC power source and connecting the end-face electrodes 46 and 47 to the driving side of the AC power source during driving. That is, the piezoelectric element 40 can be easily polarized and driven without changing the shapes of the electrodes by electrically connecting the three end-face electrodes 45, 46, and 47 in an appropriate manner.

[Fourth Embodiment]

Figure 17:
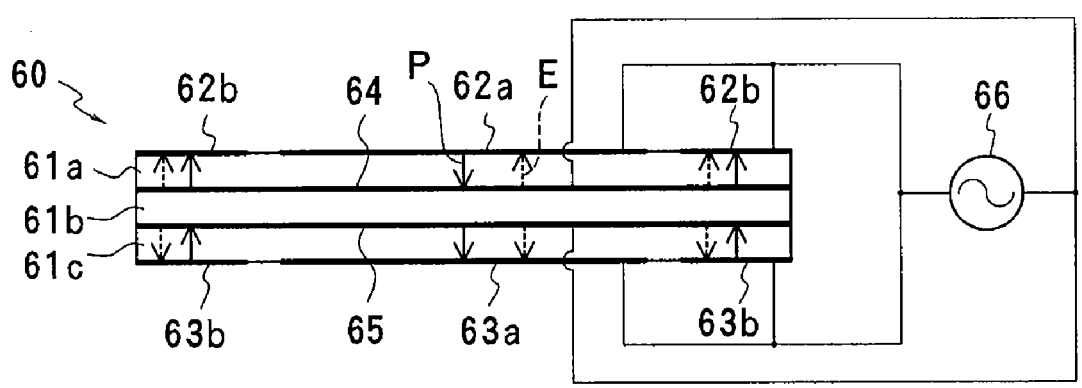
FIG. 17 is a schematic cross-sectional view of a piezoelectric element according to a fourth embodiment.

A piezoelectric element 60 shown in FIG. 17 is a laminate including three piezoelectric layers 61a to 61c, and differs from that in the embodiment shown in FIGS. 8(a) and 8(b) in that the piezoelectric element 60 includes the intermediate layer 61b for relieving stress at a central portion in the thickness direction. Electrodes on the top and bottom surfaces are split into central electrode portions 62a and 63a and peripheral electrode portions 62b and 63b, respectively, and continuous electrodes 64 and 65 extending over the central area and the peripheral area are disposed between the layers. The continuous electrodes 64 and 65 are disposed on either side of the intermediate layer 61b. In this example, the intermediate layer 61b is not polarized, and not expanded or contracted. As shown in FIG. 17, one end of an AC power source 66 is connected to the split electrode portions 62a, 62b, 63a, and 63b and the other end is connected to the continuous electrodes 64 and 65 during driving. When electric fields oriented in directions indicated by broken-line arrows E are applied, for example, the central area can be convexed in an upward direction, and the peripheral area can be concaved in a downward direction. Also in this case, short-circuits caused by migration can be prevented since the potentials of the central electrode portion 62a and the peripheral electrode portion 62b that are adjacent to each other in the same plane are the same and the potentials of the central electrode portion 63a and the peripheral electrode portion 63b that are adjacent to each other in the same plane are the same, and the driving circuit can be simplified. Since the intermediate layer 61b relieves the stress acting on the interface between the upper piezoelectric layer 61a and the lower piezoelectric layer 61c, the piezoelectric element can be efficiently bent.

[Fifth Embodiment]

Figure 18:
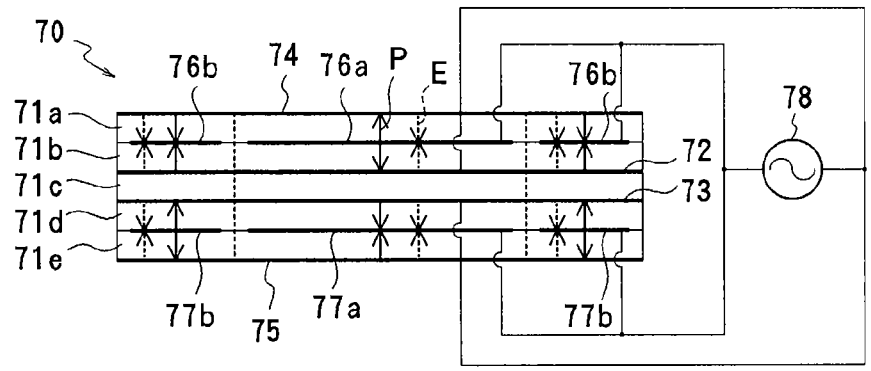
FIG. 18 is a schematic cross-sectional view of a piezoelectric element according to a fifth embodiment.

A piezoelectric element 70 shown in FIG. 18 is a laminate including five piezoelectric layers 71a to 71e. The piezoelectric element 70 includes the intermediate layer 71c for relieving stress at a central portion in the thickness direction. The central portion and the peripheral portion in each layer are polarized in opposite directions, and the directions of polarization in the two piezoelectric layers 71b and 71d adjacent to the middle position in the thickness direction are the same. However, the directions of polarization in the outer piezoelectric layers 71a and 71e are opposite to those in the piezoelectric layers 71b and 71d, respectively, adjacent to each other in the thickness direction. In this example, electrodes 72 and 73 disposed on either side of the intermediate layer 71c and electrodes 74 and 75 disposed on the top and bottom surfaces, respectively, are continuous electrodes, and other interlayer electrode portions 76a, 76b, 77a, and 77b are split electrodes split so as to correspond to the central portion and the peripheral portion. That is, the continuous electrodes and the split electrodes are alternatively disposed in the layer laminating direction. As shown in FIG. 18, one end of an AC power source 78 is connected to the split electrode portions 76a, 76b, 77a, and 77b and the other end is connected to the continuous electrodes 72, 73, 74, and 75 during driving. When electric fields oriented in directions indicated by broken-line arrows E are applied, for example, the central area can be convexed in an upward direction, and the peripheral area can be concaved in a downward direction. Also in this case, short-circuits caused by migration can be prevented since the potentials of the central electrode portion 76a and the peripheral electrode portion 76b that are adjacent to each other in the same plane are the same and the potentials of the central electrode portion 77a and each other in the same plane are the same, and the driving circuit can be simplified. The piezoelectric element shown in FIG. 17 includes three piezoelectric layers and the piezoelectric element shown in FIG. 18 includes five piezoelectric layers. However, a plurality of piezoelectric layers can be further laminated on the outermost layers, and the continuous electrodes and the split electrodes can be alternatively formed.

[Sixth Embodiment]

Figure 19A:
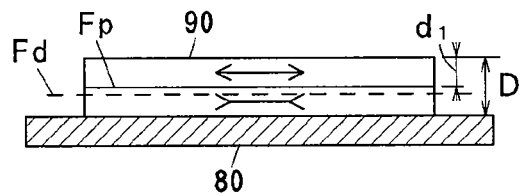
FIGS. 19(a) and 19(b) are schematic cross-sectional views of a piezoelectric element and a diaphragm used for a piezoelectric pump according to a sixth embodiment of the present invention.
Figure 19B:
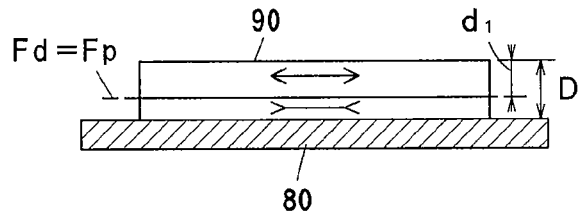

FIGS. 19(a) and 19(b) illustrate a diaphragm 80 and a piezoelectric element 90 fixed to one side of the diaphragm used for a piezoelectric pump according to the present invention. The piezoelectric element 90 is of the bimorph type, and can be uniformly bent unlike a piezoelectric element in which the central area and the peripheral area are bent in opposite directions, such as those in the first to fifth embodiments.

When the strength of driving electric fields applied to the piezoelectric element alone and the degree of polarization of the piezoelectric element are uniform in the piezoelectric element 90 of the bimorph type alone, the displacement can be maximized by, for example, setting an inversion plane Fp at which the expansion/contraction directions are inverted at the middle position in the thickness direction as shown in FIG. 19(a). However, when the inversion plane is set at the middle position in the thickness direction of the piezoelectric element 90 in the case where the piezoelectric element 90 of the bimorph type is bonded to the diaphragm 80 functioning like an elastic film, the displacement cannot be maximized. This is because a neutral plane Fd of the entire diaphragm is shifted from the middle position Fp in the thickness direction of the piezoelectric element to the diaphragm 80. To solve this, the inversion plane Fp of the piezoelectric element is formed at a position shifted from the middle position in the thickness direction to the diaphragm as shown in FIG. 19(b) such that the neutral plane Fd of the entire diaphragm and the inversion plane Fp of the piezoelectric element correspond to each other.

Figure 20A:
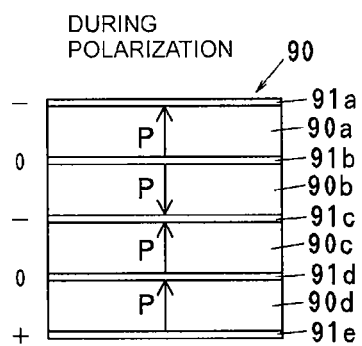
FIGS. 20(a) and 20(b) are schematic cross-sectional views during polarization and during driving, respectively, when the number of lamination layers of the piezoelectric element is changed.
Figure 20B:
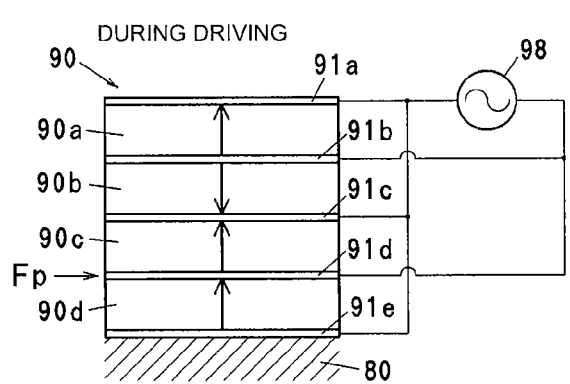

FIGS. 20(a) and 20(b) illustrate a method for matching the inversion plane Fp of the piezoelectric element 90 with the neutral plane Fd of the entire diaphragm by changing the number of lamination layers at either side of the inversion plane Fp of the piezoelectric element 90. The piezoelectric element 90 in this example is a laminate including a plurality of piezoelectric layers 90a to 90d having electrodes 91b to 91d interposed therebetween, and electrodes 91a and 91e are formed on the top and bottom surfaces, respectively. The diaphragm 80 is bonded to the bottom surface of the piezoelectric element 90. FIG. 20(a) illustrates voltage application during polarization. Polarities P indicated by arrows can be obtained by, for example, applying DC voltages such that the electrodes 91a and 91c are at a negative potential, the electrode 91e is at a positive potential, and the electrodes 91b and 91d are at a ground potential. FIG. 20(b) illustrates voltage application during driving. When one end of an AC power source 98 is connected to the electrodes 91a, 91c, and 91e and the other end is connected to the electrodes 91b and 91d as shown in FIG. 20(b), the upper three layers 90a to 90c and the lower one layer 90d expand or contract in opposite directions. In this case, the inversion plane Fp is located at the position of the surface of the second electrode 91d from the bottom. The number of piezoelectric layers to be laminated in the piezoelectric element 90 can be arbitrarily selected.

FIGS. 21(a) and 21(b) illustrate a method for changing the thickness of a piezoelectric layer at either side of the inversion plane Fp of a piezoelectric element 92. The piezoelectric element 92 in this example is a laminate including two piezoelectric layers 92a and 92b with different thicknesses having an electrode 93b interposed therebetween, and electrodes 93a and 93c are formed on the top and bottom surfaces, respectively. FIG. 21(a) illustrates voltage application during polarization, and Fig. 21(b) illustrates voltage application during driving. The upper piezoelectric layer 92a has a thickness larger than that of the lower piezoelectric layer 92b, and different voltages depending on the thicknesses are applied during polarization. Voltage reducing means 99 such as a resistance is connected so as to reduce the potential of the bottom-face electrode 93c compared with that of the top-face electrode 93a during driving. The inversion plane Fp is located at the position of the surface of the interlayer electrode 93b. The voltage application during polarization and that during driving shown in FIGS. 21(a) and 21(b), respectively, are only examples, and can be arbitrarily set.

FIGS. 22(a) and 22(b) illustrate a method for matching the inversion plane of the piezoelectric element with the neutral plane of the entire diaphragm by changing the strength of driving electric fields applied to upper and lower piezoelectric layers in a piezoelectric element 94. The piezoelectric element 94 is a laminate including two piezoelectric layers 94a and 94b with the same thickness having an electrode 95b interposed therebetween, and electrodes 95a and 95c are formed on the top and bottom surfaces, respectively. FIG. 22(a) illustrates voltage application during polarization, and FIG. 22(b) illustrates voltage application during driving. As shown in FIG. 22(b), the field strength of the upper piezoelectric layer 94a is increased compared with that of the lower piezoelectric layer 94b using the voltage reducing means 99. In this case, the expansion/contraction stress imposed on the upper piezoelectric layer 94a is higher than that on the lower piezoelectric layer 94b, and the neutral plane of the piezoelectric element alone is located at a position shifted from the inversion plane Fp to the opposite side of the diaphragm 80. With this, the inversion plane Fp can match the neutral plane of the entire diaphragm. The ratio of the field strength of the upper piezoelectric layer 94a to that of the lower piezoelectric layer 94b during driving can be arbitrarily set depending on the Young's modulus and the thickness of the diaphragm 80. When a plurality of piezoelectric layers are laminated in this case, the thickness of the piezoelectric layers at either side of the inversion plane Fp can be changed.

FIGS. 23(a) and 23(b) illustrate a method for matching the inversion plane of the piezoelectric element with the neutral plane of the entire diaphragm by changing the degrees P of polarization of upper and lower piezoelectric layers in a piezoelectric element 96. The piezoelectric element 96 is a laminate including two piezoelectric layers 96a and 96b with the same thickness having an electrode 97b interposed therebetween, and electrodes 97a and 97c are formed on the top and bottom surfaces, respectively. FIG. 23(a) illustrates voltage application during polarization performed such that the degree P1 of polarization of the upper piezoelectric layer 96a is higher than the degree P2 of polarization of the lower piezoelectric layer 96b. Voltage reducing means 99 is not required during driving as shown in FIG. 23(b) since the same electric fields are applied to the upper piezoelectric layer 96a and the lower piezoelectric layer 96b. In this case, the expansion/contraction stress imposed on the upper piezoelectric layer 96a is higher than that on the lower piezoelectric layer 96b, and the neutral plane of the piezoelectric element alone is located at a position shifted from the inversion plane to the opposite side of the diaphragm 80. With this, the inversion plane Fp can match the neutral plane of the entire diaphragm. When a plurality of piezoelectric layers are laminated, the thickness of the piezoelectric layers at either side of the inversion plane Fp can be changed.

The effect of matching the inversion plane Fp of the piezoelectric element 90 with the neutral plane Fd of the entire diaphragm as described above becomes marked as the rigidity and the thickness of the diaphragm are increased. The material of the diaphragm can be as soft and thin as possible so as not to interfere with the motion of the piezoelectric element. However, a diaphragm with high rigidity is suitable when, for example, it is necessary to increase the generated pressure of the pump or to increase the driving frequency. In this case, matching of the inversion plane of the piezoelectric element with the neutral plane of the entire diaphragm produces a significant effect.

Results of simulation performed by changing the thicknesses of piezoelectric bodies of the piezoelectric element at the expansion side and the contraction side will now be shown. The position of the inversion plane with respect to the total thickness of the piezoelectric bodies is defined as follows:

Position of inversion plane (%)=thickness d1 of upper layer/total thickness D

That is, 50% indicates that the inversion plane is located at the middle position of the bimorph piezoelectric element. The value is increased from 50% as the thickness of the upper layer is further increased. The value becomes 100% when only the upper layer exists (no lower layer exists).

Figure 24:
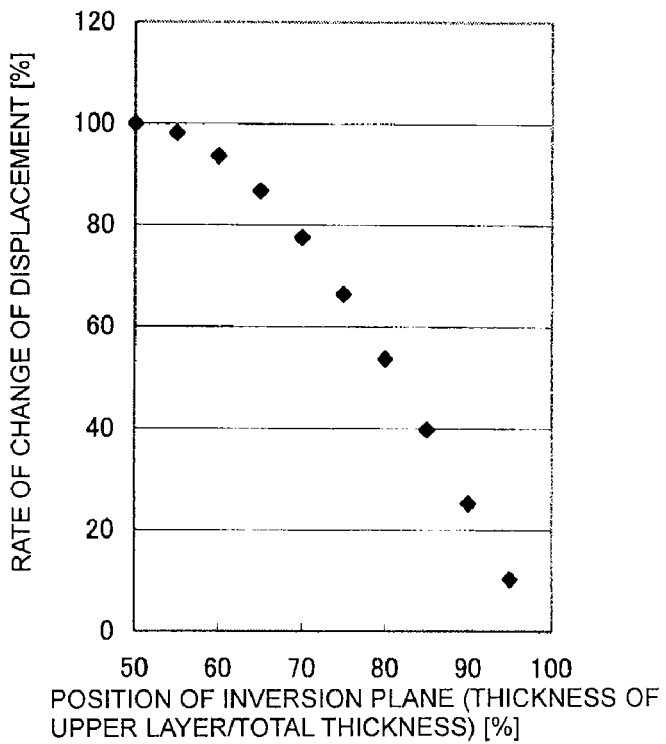
FIG. 24 illustrates a relationship between a ratio of the thickness of an upper layer to the total thickness of a bimorph piezoelectric element alone and a rate of change of displacement.

FIG. 24 illustrates a rate of change of displacement when the thickness d1 of the upper layer of a bimorph piezoelectric element having a total thickness D of 0.30 mm is gradually increased from a state where the thicknesses of the upper and lower layers are both 0.15 mm. 50% indicates that there is no difference between the thicknesses of the upper and lower layers each having a thickness of 0.15 mm, and 100% indicates that only the upper layer having a thickness of 0.30 mm exists. As is clear from the drawing, the displacement is reduced as the thickness d1 of the upper layer is increased.

Figure 25:
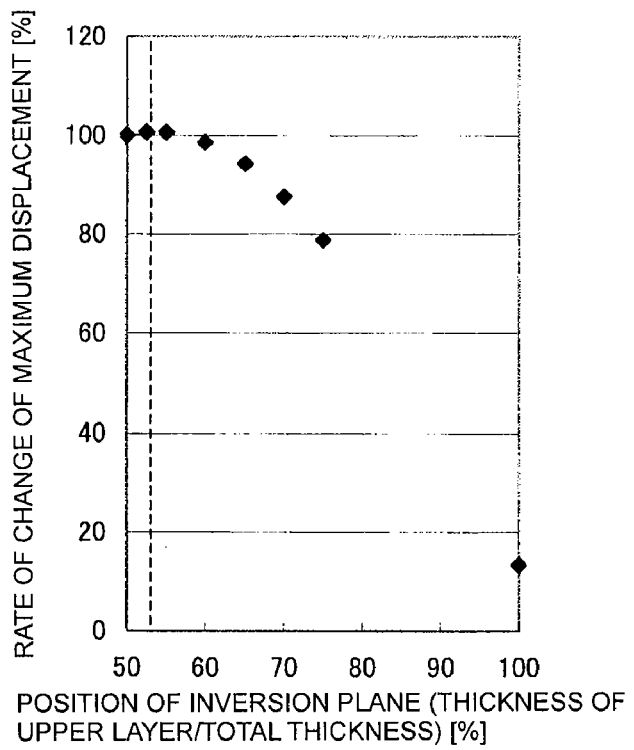
FIG. 25 illustrates a relationship between a ratio of the thickness of an upper layer to the total thickness of a bimorph piezoelectric element and a rate of change of displacement when the piezoelectric element is bonded to a diaphragm composed of glass epoxy.

FIG. 25 illustrates a rate of change of displacement when the thickness d1 of the upper layer of a bimorph piezoelectric element having a total thickness D of 0.30 mm and bonded to a glass epoxy board having a thickness of 0.1 mm is gradually increased. When the thickness d1 of the upper layer with respect to the total thickness D is approximately 52.5%, the rate of change of the displacement reaches a peak of 100.61%. Thus, although slight, the displacement is increased.

Figure 26:
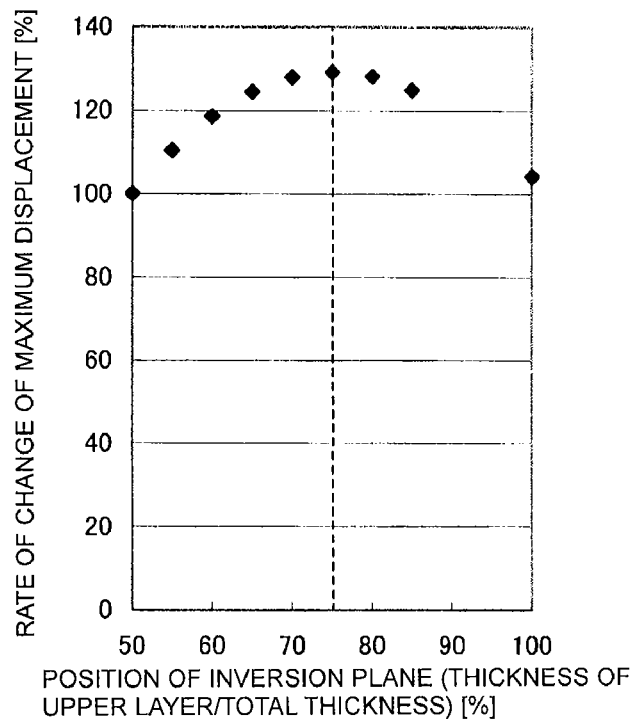
FIG. 26 illustrates a relationship between a ratio of the thickness of an upper layer to the total thickness of a bimorph piezoelectric element and a rate of change of displacement when the piezoelectric element is bonded to a diaphragm composed of SUS.
Figure 27:
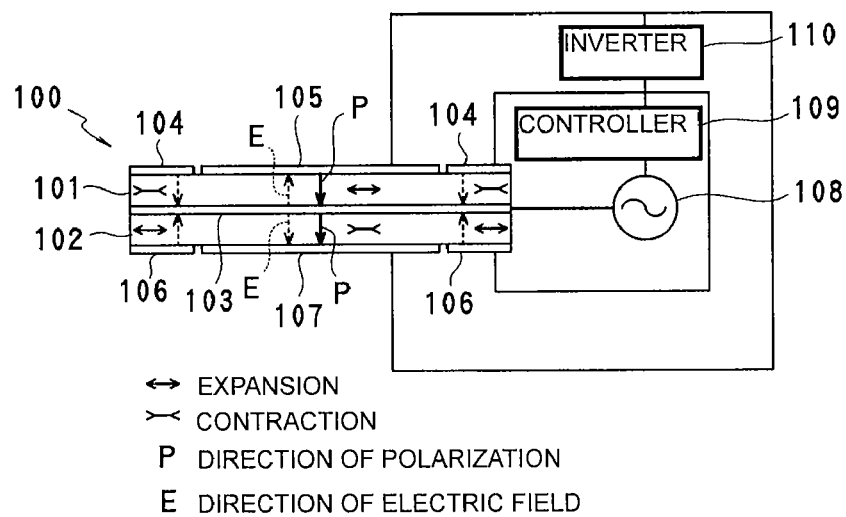
FIG. 27 is a circuit diagram during driving of a known piezoelectric element.

FIG. 26 illustrates a rate of change of displacement when the thickness d1 of the upper layer of a bimorph piezoelectric element having a total thickness D of 0.30 mm and bonded to a SUS board having a thickness of 0.1 mm is gradually increased. In this case, the displacement reaches a peak when the thickness d1 of the upper layer with respect to the total thickness D is 75%. Compared with the case of 50% where the upper and lower layers have the same thickness, the rate of change of the displacement reaches 129.18% by matching the inversion plane with the neutral plane, and a marked increase of +30% in the displacement can be achieved. At the same time, heat generation can also be prevented.

The present invention is not limited to the above-described embodiments, and various modifications are possible. In the sixth embodiment, the structure in which the inversion plane of the piezoelectric element matches the neutral plane of the entire diaphragm is applied to an example in which a piezoelectric element of the typical bimorph type is bonded to a diaphragm. However, the structure can also be applied to examples in which a piezoelectric element whose central area and peripheral area are bent in opposite directions is bonded to a diaphragm, such as those in the first to fifth embodiments.

Since the piezoelectric pump according to the present invention is compact and low-profiled, the piezoelectric pump is useful for fuel supply to fuel cells for, for example, portable devices, and for, for example, circulation of cooling water. However, the application is not limited to these.

The invention claimed is:

1. A piezoelectric pump comprising:
   a pump body including a pump chamber; and
   a piezoelectric element supported by the pump body so as to close the pump chamber, the piezoelectric element including a central area and a peripheral area surrounding the central area, the central area and the peripheral area being configured to bend in opposite directions in accordance with driving voltages applied to the piezoelectric element so as to change the volume of the pump chamber; wherein
   the piezoelectric element comprises a plurality of piezoelectric layers and electrodes interposed therebetween;
   a central area and a peripheral area of each of the plurality of piezoelectric layers are polarized in opposite directions to each other in a thickness direction of the plurality of piezoelectric layers; and
   the electrodes are configured such that driving electric fields oriented in the same thickness direction are applied to the central area and the peripheral area of each of the plurality of piezoelectric layers, and driving voltages at a common potential are applied to the electrodes located in common planes of the plurality of piezoelectric layers.

2. The piezoelectric pump according to claim 1, wherein the electrodes include split electrodes that are split so as to correspond to the central area and the peripheral area and continuous electrodes extending over the central area and the peripheral area, and the split electrodes and the continuous electrodes are alternately disposed in a direction along which the plurality of piezoelectric layers are laminated.

3. The piezoelectric pump according to claim 2, wherein two or more of the continuous electrodes are disposed between two of the split electrodes arranged adjacent to each other in the direction along which the plurality of piezoelectric layers are laminated, and
   an intermediate layer that is not bent spontaneously when the driving voltages are applied is disposed between the two or more continuous electrodes.

4. The piezoelectric pump according to claim 2, wherein the split electrodes each include a central electrode portion located at a position corresponding to the central area, a peripheral electrode portion located at a position corresponding to the peripheral area and surrounding the central electrode portion with a gap interposed therebetween, and an extension electrode portion extending from the central electrode portion to an outer periphery of the piezoelectric layers so as to cross the peripheral electrode portion;

the piezoelectric element includes a first piezoelectric portion and a second piezoelectric portion disposed in the direction along which the plurality of piezoelectric layers are laminated, the first and second piezoelectric portions expanding or contracting in opposite directions when the driving voltages are applied; and the piezoelectric element includes a first connecting electrode and a second connecting electrode positioned at the outer periphery thereof, the first connecting electrode connecting the extension electrode portions extending from the central electrode portions located between the plurality of piezoelectric layers in the first piezoelectric portion and the peripheral electrode portions located between the plurality of piezoelectric layers in the second piezoelectric portion, and the second connecting electrode connecting the peripheral electrode portions located between the plurality of piezoelectric layers in the first piezoelectric portion and the extension electrode portions extending from the central electrode portions located between the plurality of piezoelectric layers in the second piezoelectric portion.

5. The piezoelectric pump according to claim 4, wherein the first piezoelectric portion and the second piezoelectric portion each include a plurality of laminated piezoelectric layers;

the central electrode portions located between the plurality of laminated piezoelectric layers in the first piezoelectric portion are connected to each other, and the peripheral electrode portions located between the plurality of laminated piezoelectric layers in the first piezoelectric portion are connected to each other; and the central electrode portions located between the plurality of laminated piezoelectric layers in the second piezoelectric portion are connected to each other, and the peripheral electrode portions located between the plurality of laminated piezoelectric layers in the second piezoelectric portion are connected to each other.

6. The piezoelectric pump according to claim 1, wherein the piezoelectric element includes a neutral area that is not bent spontaneously when the driving voltages are applied, the neutral area being located outside the peripheral area adjacent to the outer periphery, the piezoelectric element being supported by the pump body at the neutral area.

7. The piezoelectric pump according claim 3, wherein the piezoelectric layers are rectangular;

the central electrode portions are circular; and the peripheral electrode portions are ring-shaped and concentric with the central electrode portions.

8. The piezoelectric pump according to claim 1, further comprising a diaphragm that separates the piezoelectric element from the pump chamber.

9. The piezoelectric pump according to claim 8, wherein the diaphragm is bonded to a surface of the piezoelectric element adjacent to the pump chamber in face-to-face relationship.

10. A piezoelectric pump comprising:

a pump body including a pump chamber;

a piezoelectric element supported by the pump body so as to close the pump chamber, the piezoelectric element being bent by application of a voltage so as to change a volume of the pump chamber, wherein the piezoelectric element is a bimorph type piezoelectric element in which a plurality of piezoelectric layers are laminated; and a diaphragm separating the piezoelectric element from the pump chamber, the diaphragm being bonded to a surface of the piezoelectric element adjacent to the pump chamber in a face-to-face relationship; wherein the piezoelectric element includes an inversion plane at which expansion/contraction directions of the piezoelectric element when the voltage is applied are inverted;

the piezoelectric element and the diaphragm bonded thereto include a neutral plane at which expansion/contraction does not occur when the voltage is applied; and the inversion plane of the piezoelectric element matches the neutral plane of the piezoelectric element and the diaphragm.

11. The piezoelectric pump according to claim 10, wherein a thickness of a first portion of the piezoelectric element at a first side of the inversion plane separated from the diaphragm is larger than a thickness of a second portion of the piezoelectric element at a second side of the inversion plane adjacent to the diaphragm.

12. The piezoelectric pump according to claim 10, wherein a number of laminated piezoelectric layers at a first side of the inversion plane separated from the diaphragm is larger than a number of laminated piezoelectric layers at a second side of the inversion plane adjacent to the diaphragm.

13. The piezoelectric pump according to claim 10, wherein a strength of an electric field of a driving voltage applied to a piezoelectric layer at a first side of the inversion plane separated from the diaphragm is higher than a strength of an electric field of a driving voltage applied to a piezoelectric layer at a second side of the inversion plane adjacent to the diaphragm.

14. The piezoelectric pump according to claim 10, wherein a degree of polarization of a piezoelectric layer at a first side of the inversion plane separated from the diaphragm is higher than a degree of polarization of a piezoelectric layer at a second side of the inversion plane adjacent to the diaphragm.

* * * * *